US008334684B1

(12) United States Patent
Lynch

(10) Patent No.: US 8,334,684 B1
(45) Date of Patent: Dec. 18, 2012

(54) METHOD FOR IMPROVING SENSITIVITY FOR RADIOMETERS

(75) Inventor: Jonathan J. Lynch, Oxnard, CA (US)

(73) Assignee: HRL Laboratories, LLC, Malibu, CA (US)

( * ) Notice: Subject to any disclaimer, the term of this patent is extended or adjusted under 35 U.S.C. 154(b) by 423 days.

(21) Appl. No.: 12/699,220

(22) Filed: Feb. 3, 2010

(51) Int. Cl.
*G01R 19/00* (2006.01)

(52) U.S. Cl. .................................. 324/76.14; 324/76.11

(58) Field of Classification Search .......... 324/612–614, 324/76.11, 76.14
See application file for complete search history.

(56) References Cited

U.S. PATENT DOCUMENTS

| | | | | |
|---|---|---|---|---|
| 4,665,401 A * | 5/1987 | Garrard et al. | .................. | 342/75 |
| 6,792,252 B2 * | 9/2004 | Kimball et al. | ............ | 455/127.3 |
| 7,522,274 B2 * | 4/2009 | Salmon | ......................... | 356/216 |
| 2003/0137344 A1 * | 7/2003 | Kimball et al. | ................... | 330/9 |

OTHER PUBLICATIONS

Tiuri, M. E., "Radio Astronomy Receivers," *IEEE Transactions on Antennas and Propagation*, vol. 12 issue 7, pp. 930-938 (1964).

Batelaan, P.D., et al., "Improved Noise-Adding Radiometer for Microwave Receivers," National Technology Transfer Cetner (NTTC), Wheeling, WV, vol. 73-10345 (1973).

Kane, B., "High-Sensitivity W-Band MMIC Radiometer Modules," Microwave and Millimeter-Wave Monolithic Circuits Symposium, 1995, Digest of Papers, IEEE 1995, pp. 59-62.

Stelzried, C., "Noise Adding Radiometer Performance Analysis," The Telecommun. and Data Acquisition Rept., Jet Propulsion Laboratory, pp. 98-106 (1980).

Janssen, M. A., et al., "Direct Imaging of the CMB from Space," Astrophysical Journal, pp. 15 (1996).

Ulaby, "Microwave Remote Sensing," vol. 1, Arlech House, MA, 1981, section 6-9, pp. 369-374.

Kraus, J. D., et al., "Radio Astronomy," Ch. Radio-Telescope Receivers, McGraw Hill, NY. 1966, pp. 289-290.

* cited by examiner

*Primary Examiner* — Vincent Q Nguyen
(74) *Attorney, Agent, or Firm* — Ladas & Parry

(57) ABSTRACT

A radiometer for sensing energy includes a first amplifier for amplifying the energy, the first amplifier having a first output, a reference amplifier having a reference input and having a second output, a second amplifier having an input coupled to the first output and the second output, and a controller for switching on and off the first amplifier and the reference amplifier, so that the when the first amplifier is on, the reference amplifier is off, and so that the when the reference amplifier is on, the first amplifier is off.

20 Claims, 7 Drawing Sheets

METHOD FOR IMPROVING SENSITIVITY FOR RADIOMETERS

TECHNICAL FIELD

This disclosure relates to methods for compensating drift and 1/f noise in radiometers, such as imaging arrays and in particular for millimeter wave imaging arrays.

BACKGROUND

Radiometers such as imaging arrays have sensitivities that are limited by drift and 1/f noise. FIG. 1 shows a graph for a typical 1/f noise spectrum. The 1/f noise has a frequency spectrum (noise vs. frequency (f)) that generally follows a 1/f curve 11 and hence the name for 1/f noise. Above a knee frequency 15 the noise is generally white noise. The cause of 1/f noise is related to properties inherent in semiconductors, which are used in many applications including imaging arrays. The noise at frequencies below the knee frequency 15 causes the imaging array's output to drift in time. Therefore, it cannot be determined whether the output of a sensor in a radiometer or an imaging array is changing because the scene is changing or whether the output change is due to 1/f noise and drift, unless some step is taken to compensate or calibrate out the drift.

In mechanically scanned arrays the sensors are moved to scan an image. For example, a mechanically scanned array can be a line array of sensors. Mechanically scanning the imaging elements modulates the signals by creating a time varying element output as the element scans across a scene. This modulation shifts the image signal to a higher frequency and effectively separates the signal from the 1/f noise in frequencies below the knee frequency. One can subtract the average value of the signal across the entire scan from the scan signal and limit the drift to what occurs within that scan as disclosed by M. A. Janssen, D. Scott, M. White, M. D. Seiffert, C. R. Lawrence, K. M. Gorski, M. Dragovan, T. Gaier, K. Ganga, S. Gulkis, A. E. Lange, S. M. Levin, P. M. Lubin, P. Meinhold, A. C. S. Readhead, P. L. Richards, J. E. Ruhl, "Direct images of the CMB from space," Astrophysical journal, 1996, pp. 15. This method has the advantage of not requiring any additional hardware; however, appreciable drift can still occur within the scan period. To ensure minimal impact of drift on the sensor performance, the image must be scanned at a rate at least four times the knee frequency, which modulates the image signal to be within the white noise spectrum of the 1/f noise. Because typical commercial sensors have knee frequencies of 1 KHz or more, this method cannot be effectively applied due to the high scan rates required.

The methods used to calibrate staring arrays (i.e. non-scanned arrays) do not depend on movement of the sensor elements; however, these methods can also be applied to scanned arrays if desired. One method uses a switch, called a Dicke switch, to modulate the image signal, as disclosed in Ulaby, Microwave Remote Sensing, Vol 1, Artech House, MA, 1981, section 6-9. Another method of modulating the image signal is to use a rotating optical blade, which is called an optical chopper, in front of the sensors. The Dicke switch and the optical chopper both modulate the input signal to move the image signal spectral energy away from the low frequency noise, thereby minimizing drift effects.

The Dicke switch must be installed in each element separately, and therefore adds significant cost to the array. Furthermore, the Dicke switch introduces losses that degrade the sensitivity of the array.

An optical chopper has the advantage of modulating all of the elements at once because it can be placed in front of all the sensors. The drawback of optical choppers is that they cannot spin at high enough rates to modulate the image signal above typical knee frequencies. In addition, optical choppers often create audible noise and also require significant space when used with large arrays. Because an optical chopper is a moving part, more maintenance is required.

Another method of drift compensation is called noise injection. In this scheme each sensor contains a noise source that is coupled into each sensor input. The noise source is switched on and off at a rate higher than the knee frequency. By taking the ratio of the output of the sensor during the on and off times, one can eliminate the output drift due to temporal gain fluctuations. This method is disclosed in Ulaby, Microwave Remote Sensing, Vol 1, Artech House, MA, 1981, section 6-12. John D. Kraus, in Radio-Telescope Receivers, McGraw Hill, NY, 1966, pages 289-290 discusses the same method for a radio telescope receiver. This method requires additional hardware to be designed into each of the sensors, adding significant cost. Furthermore, the ability to calibrate out drift is limited to the inherent stability of the noise source. Noise sources contain uncontrolled amplitude fluctuations, typically with a 1/f type of noise spectrum, and these fluctuations add additional drift to the output that cannot be compensated using the noise injection method disclosed by Ulaby and Kraus.

As discussed above, one common method for compensating for gain fluctuations is the so-called Dicke switch. By switching between an antenna and a stable reference temperature at a rate fast compared to the rate of gain fluctuations (typically a few khz), separate estimates can be formed of the scene temperature and a stable reference temperature. Subtracting the two estimates gives the difference between the scene and the reference, and any added noise voltage or small gain fluctuations will be subtracted out.

The problem with this method is that a radio frequency (RF) switch is not that easy to fabricate and an RF switch may introduce insertion loss before the LNA, which directly reduces the radiometer sensitivity. Switches are typically made from PIN diodes, a semiconductor device that is not easily fabricated on the same IC as the LNA devices (typically InP or GaAs HEMTs). The result is that PIN switches are usually made separately, so their inclusion increases the radiometer cost due to the additional RF integrated circuit (IC) assembly.

What is needed is a method for compensating out 1/f noise and drift for a radiometer without the need to fabricate and integrate an RF switch and without incurring the insertion loss caused by an RF switch. The embodiments of the present disclosure answer these and other needs.

SUMMARY

In a first embodiment disclosed herein, a radiometer for sensing energy comprises a first amplifier for amplifying the energy, the first amplifier having a first output, a reference amplifier having a reference input and having a second output, a second amplifier having an input coupled to the first output and the second output, and a controller for switching on and off the first amplifier and the reference amplifier, so that the when the first amplifier is on, the reference amplifier is off, and so that the when the reference amplifier is on, the first amplifier is off.

In another embodiment disclosed herein, a method for cancelling noise in a radiometer for sensing energy comprises providing a first amplifier for amplifying the energy, the first amplifier having a first output, providing a reference amplifier having a reference input and having a second output, providing a second amplifier having an input coupled to the first output and the second output, switching on and off the first amplifier and the reference amplifier, so that the when the first amplifier is on, the reference amplifier is off, and so that the when the reference amplifier is on, the first amplifier is off, and providing a detector coupled to an output of the second amplifier.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
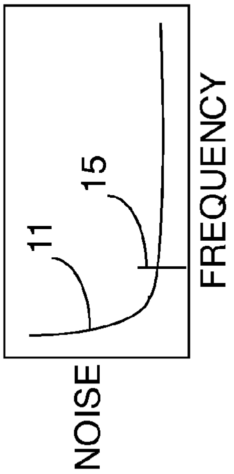
FIG. 1 PRIOR ART
FIG. 1 is a graph representative of 1/f noise in accordance with the prior art.
Figure 2:
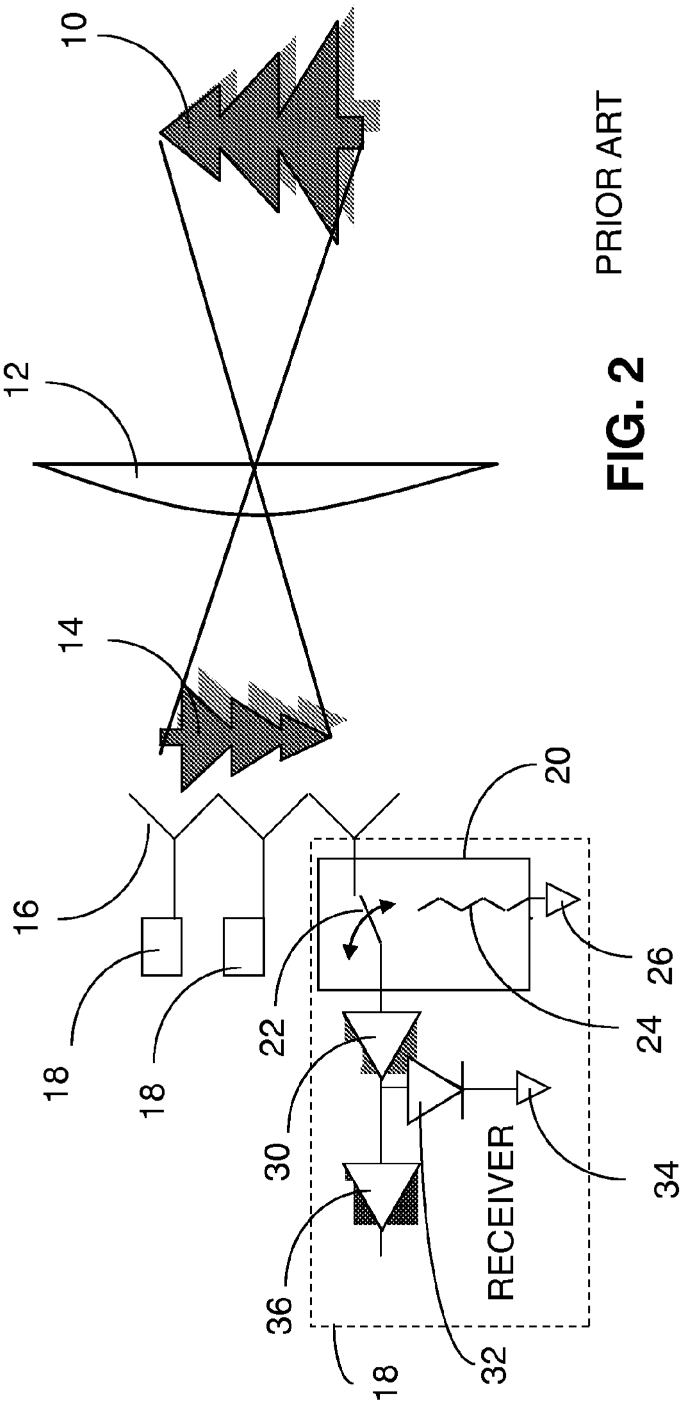
FIG. 2 PRIOR ART
FIG. 2 shows a typical imaging array with a Dicke switch in accordance with the prior art.

Referring to FIG. 2, a typical imaging array with a Dicke switch to compensate for the 1/f noise and drift is shown in accordance with the prior art. The image 10 is generally focused by a lens 12 to focus the image 14 onto a sensor array. For a millimeter wave imaging array, each sensor in the array has an antenna 16 and a millimeter wave receiver 18. A receiver 18 typically has a Dicke switch 20, a low noise amplifier 30, a detector 32 and a video amplifier 36. The detector 32 is tied to a ground 34. The purpose of the detector is to provide an output signal (voltage or current) that is proportional to the RF noise power collected from the scene. As discussed above, the Dicke switch 20 modulates the image signal 14 by switching switch 22. This switches the input to the low noise amplifier 30 between the antenna 16 and the stable thermal reference, which in this case is a resistor 24 to ground 26. If the switching is fast enough, then the image signal is modulated above the knee frequency of the 1/f noise. The modulated output of the sensor is synchronously detected to provide an output proportional to the difference between the scene temperature and the reference temperature. A key drawback of this method is that the Dicke switch 20 must be installed in each receiver 18, and therefore adds significant cost to the sensor array. Furthermore, the Dicke switch 20 introduces losses that degrade the sensitivity of the array.

In the above discussion, the receiver is described as having an LNA and a detector; however, it will be understood by one skilled in the art there are millimeter wave receivers that contain mixers, phase switches, baluns, and so on.

Figure 3:
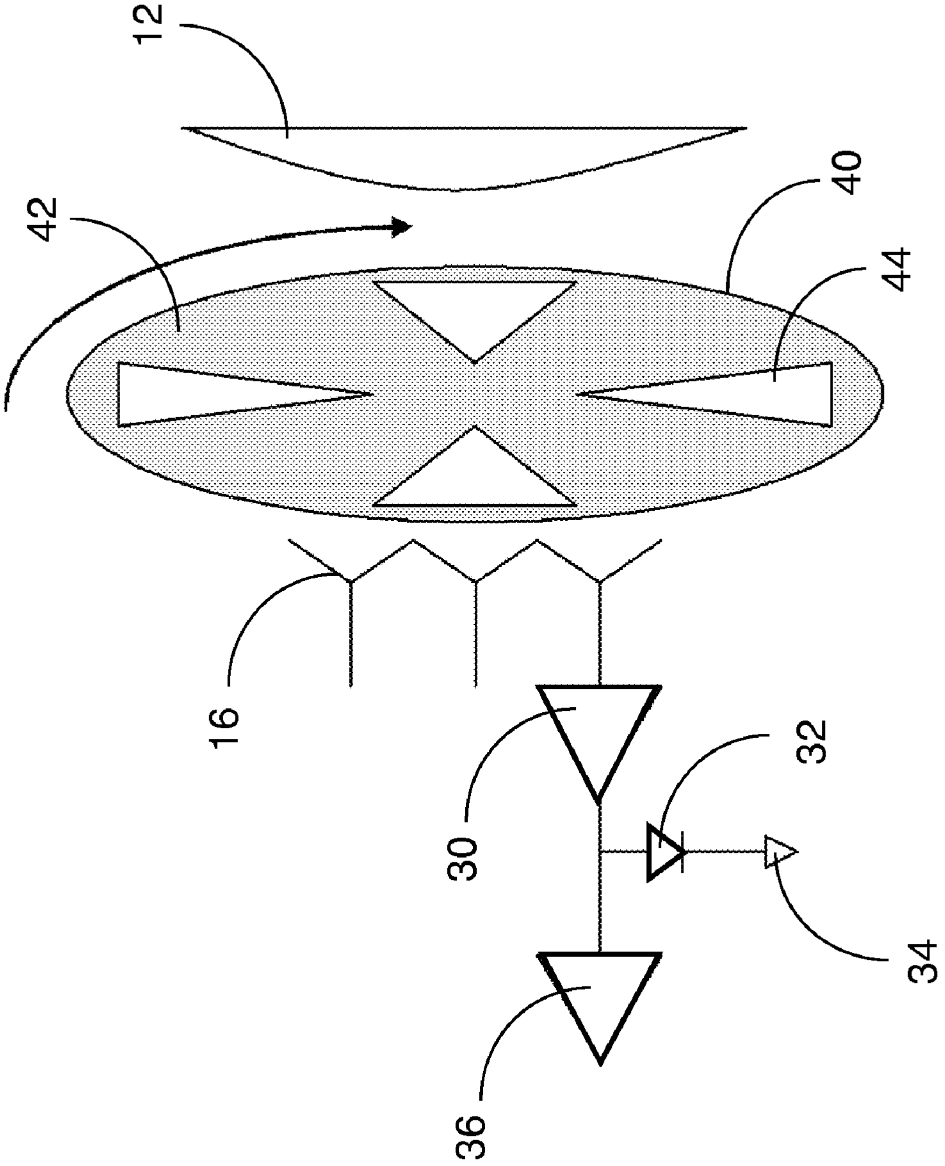
FIG. 3 PRIOR ART
FIG. 3 is a typical imaging array using an optical chopper in accordance with the prior art.

FIG. 3 shows a typical millimeter wave imaging array using an optical chopper in accordance with the prior art. The image focused by lens 12 passes through a rotating optical chopper 40 that has opaque areas 42 and open areas 44. The rotation of the opaque and open areas causes modulation of the image signal, which shifts the image signal spectrum up in frequency. The image signal then is received by the antennas 16 and the receivers, each of which include a low noise amplifier 30, detector 32 and video amplifier 36. The modulated output of the sensor is synchronously detected to provide an output proportional to the difference between the scene temperature and the reference temperature. The optical chopper 40 has the advantage of modulating all of the elements at once because it can be placed in front of all the input antennas 16. The disadvantage is that an optical chopper cannot spin at high enough rates to compensate for typical knee frequencies. In addition, optical choppers often create audible noise and require significant packaging volume. Another disadvantage is that the optical chopper is a moving part that can wear out over time and require maintenance.

Figure 4:
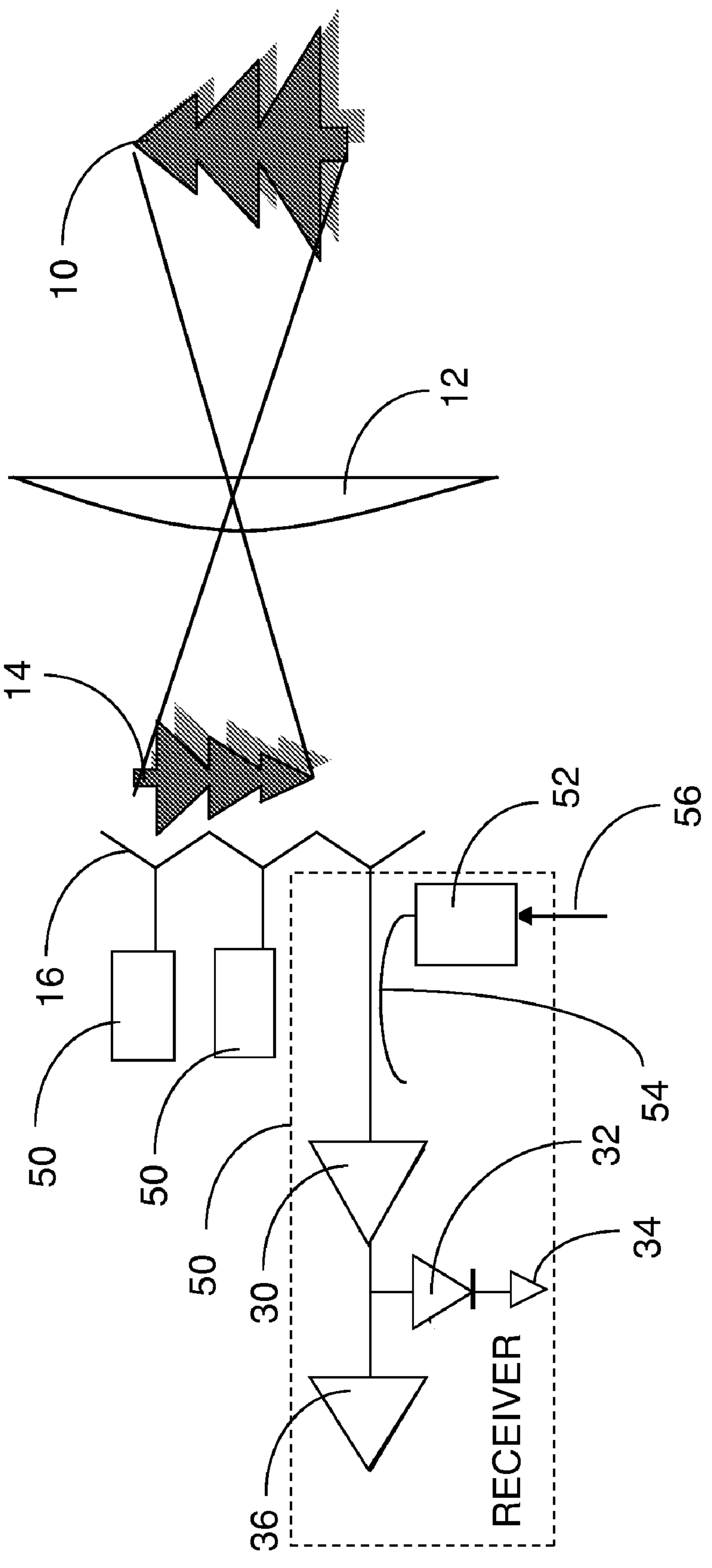
FIG. 4 PRIOR ART
FIG. 4 is typical imaging array using a noise injection method in accordance with the prior art.

FIG. 4 shows a typical imaging array using a noise injection method in accordance with the prior art. In this method each receiver 50 has a noise source 52 that is coupled into the input to low noise amplifier 30 via a directional coupler 54. The noise source 52 is switched on and off at a rate higher than the knee frequency to modulate the image signal to shift the image signal above the knee frequency.

The noise injection method of FIG. 4 requires the noise source 52 to be added into each of the receivers 50, adding significant cost.

Figure 5:
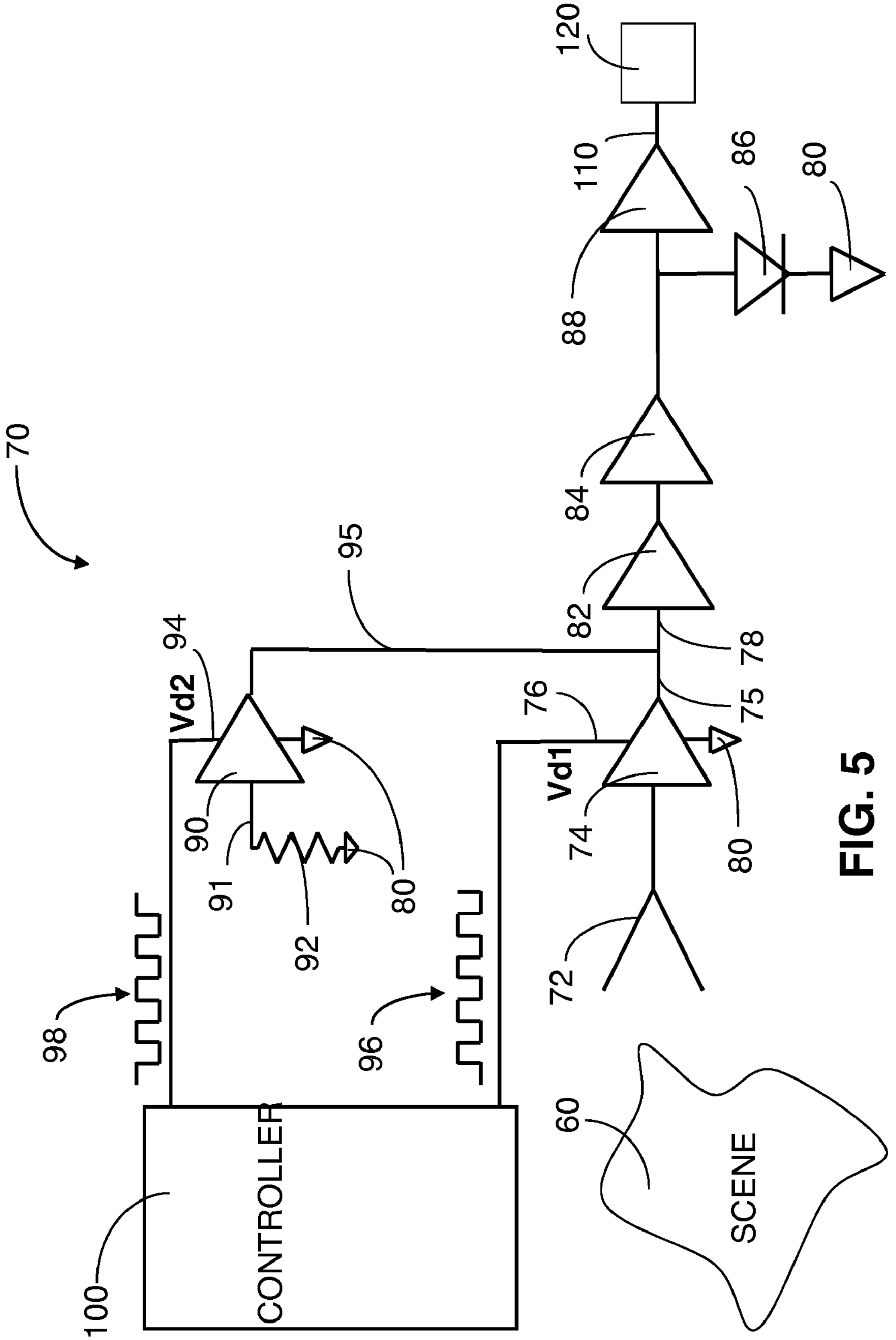
FIG. 5 is a radiometer with compensation in accordance with the present disclosure.

Referring now to FIG. 5, a radiometer 70, which may be one element in an imaging array is shown in accordance with the present disclosure. The imaging array may be a millimeter wave imaging array that generally operates in the W band, which is approximately from 75 GHz to 110 GHz. A millimeter wave imaging array senses the thermal energy from an image, and as discussed above, calibration or compensation is desirable to distinguish real temperature changes in the image from drift caused by the 1/f noise. The methods described herein may be effectively used for frequency bands other than the millimeter wave band.

In FIG. 5, the energy from a radiation source, which may be a scene 60, radiates onto antenna 72 which is coupled to a first stage low noise amplifier 74. Another reference stage low noise amplifier 90 with a thermally stable input termination 92 is placed in parallel with the first stage low noise amplifier 74 and the output 75 of the first stage low noise amplifier 74 and the output 95 of the reference stage low noise amplifier 90 are summed together so that the input 78 to second stage low noise amplifier 82 is the sum of the output 75 of the first stage low noise amplifier 74 and the output 95 of the reference stage low noise amplifier 90. In one embodiment, output 75 and output 95 may be summed by merely connecting the outputs together as shown in FIG. 5.

The second stage low noise amplifier 82 may be followed by one or more additional amplifier stages such as amplifier stage 84. These stages are followed by a detector, which may be implemented with a diode 86 tied to ground 80. The detector 86 may be followed by a video frequency output amplifier 88 having an output 110.

Returning to the reference stage low noise amplifier 90, the input 91 may be tied to ground 80 through a resistor 92. Thus, the output 95 of reference stage low noise amplifier 90 is a thermally stable reference signal, which is not dependent on the radiation from scene 60. Ideally, the resistor 92 provides a stable noise temperature.

Controller 100 provides switching controls 96 and 98, which are connected to the first stage low noise amplifier 74 and the reference stage low noise amplifier 90, respectively. Switching controls 96 and 98 alternately switch on and off the first stage low noise amplifier 74 and the reference stage low noise amplifier 90, so that the input 78 to the second stage low noise amplifier 82 alternates between the output 75 of the first stage low noise amplifier 74 and the output 95 of the reference stage low noise amplifier 90.

In one embodiment the first stage low noise amplifier 74 and the reference stage low noise amplifier 90 are field effect transistors (FETs) and the switching controls 96 and 98 are connected to the drains of the FETs for the first stage low noise amplifier 74 and the reference stage low noise amplifier 90. In this embodiment the sources of the FETs for the first stage low noise amplifier 74 and the reference stage low noise amplifier 90 may be connected to ground, the gate of the FET for the first stage low noise amplifier 74 connected to antenna 72, and the gate of the reference stage low noise amplifier 90 connected to resistor 92, which is connected to ground 80.

It is also possible to switch the FETs on and off by varying the gate voltages rather than the drain voltages.

The main advantage of the present approach versus the prior art as represented by FIG. 2, is that the insertion loss of a typical diode-based Dicke switch, such as switch 22 in FIG. 2, degrades the performance of the radiometer. Because the present invention does not use a diode based switch, but instead uses a FET amplifier, this method does not degrade performance due to switch insertion loss. In addition, standard transistor devices may be used, such as FETs as discussed above, which are easily incorporated into a low noise amplifier integrated circuit, as opposed to diode devices which are often difficult to fabricate on the same integrated circuit as the amplifier transistors.

This invention is not as effective when the dominant 1/f noise source is from the LNA itself since the first stage low noise amplifier 74, or possibly multiple stages, is only in the scene channel, with a different amplifier in the reference channel. Thus, the noise from the first stage low noise amplifiers 74 and 90 will therefore not cancel out. However, in situations where the dominant noise is coming from the detector, such as detector 86, this method will effectively allow the noise to be cancelled out through synchronous detection. In practice, the detector 1/f noise may be significantly higher than amplifier 1/f noise.

In one embodiment the switching controls 96 and 98 switch on and off at a rate f=1/T, which in one embodiment may be greater than 1 kHz. The detected output 110 from output amplifier 88 during the times that the first stage low noise amplifier 74 is "on" is averaged for a periodDT, where D is a "duty cycle" fraction between zero and one. Separately, the detected output during the times that the reference stage low noise amplifier 90 is "on" is also averaged for a periodDT. This is referred to as "time gating" and produces for each period p a series of voltage samples proportional to the RF power corresponding to the scene and reference channels as shown below:

$$V'_{scene,p} = \frac{1}{DT}\int_{-\frac{1}{2}DT}^{\frac{1}{2}DT} v(t-pT)dt,\ V'_{ref,p} = \frac{1}{DT}\int_{-\frac{1}{2}DT}^{\frac{1}{2}DT} v_{ref}\left(t-\left(p+\frac{1}{2}\right)T\right)dt$$

These averaged samples may then be averaged over an "integration time" PT to obtain:

$$V_{scene,n} = \frac{1}{P}\sum_{p=0}^{P-1} V'_{scene,nP+p},\ V_{ref,n} = \frac{1}{P}\sum_{p=0}^{P-1} V'_{ref,nP+p}.$$

The difference between the scene channel temperature and the reference channel temperature for the nth time period can then be estimated as being proportional to the difference between $V_{scene}$ and $V_{ref}$. Thus, $$T_{scene}-T_{ref}\propto V_{scene,n}-V_{ref,n}.$$

This entire process is equivalent to synchronous detection of the modulated signal. Any noise that is added to both channels will cancel out in this estimate. Also, low level gain fluctuations that are common to both channels will only contribute a small amount to this estimate. Typical gain fluctuations are on the order of 0.1%, which contributes negligible error to temperature estimate.

The time-gated averaging and integration may be performed in processor 120 coupled to the output 110 of output amplifier 88. In an imaging array, each output 110 of each radiometer 70 may be coupled to processor 120. The processor 120 may be an analog or digital signal processor, a computer with memory and a microprocessor, or an ASIC among other possible implementations of processor 120.

Figure 6A:
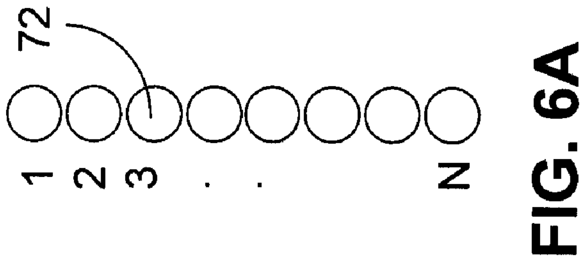
FIGS. 6A-6C are views of one dimensional vertical and horizontal imaging arrays, and a two dimensional imaging array, respectively, in accordance with the present disclosure.
Figure 6B:
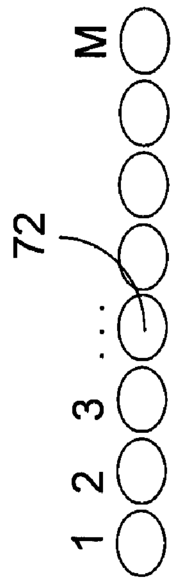
Figure 6C:
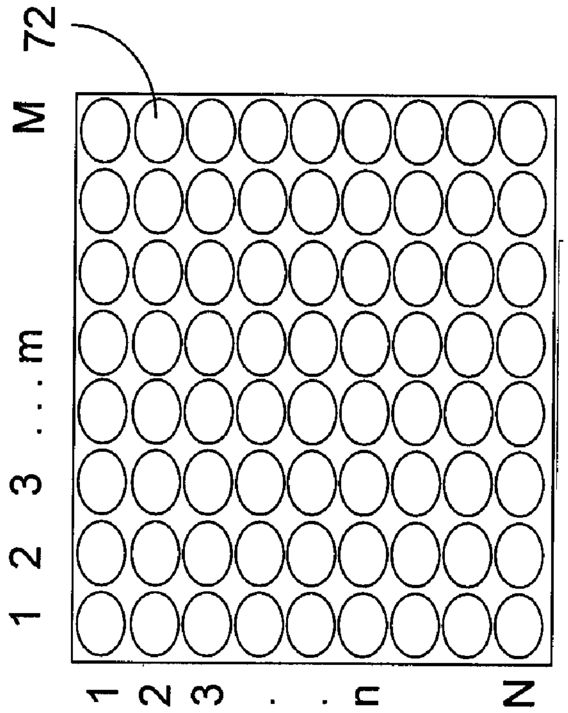

An imaging array, which may be a millimeter wave imaging array, may have an array of antennas 72 each of which is connected to a respective low noise amplifier 74, summed with a respective reference low noise amplifier 90, switched on and off by a controller, such as controller 100, and processed by a processor, such as processor 120, as described above for FIG. 5. FIGS. 6A-6C are views of a one dimensional vertical imaging array (FIG. 6A), a horizontal imaging array (FIG. 6B), and a two dimensional imaging array (FIG. 6C) with antennas 72 in accordance with the present disclosure. The one dimensional arrays may be used in scanning image sensors and the two dimensional array may be used in a staring image sensor.

Figure 7A:
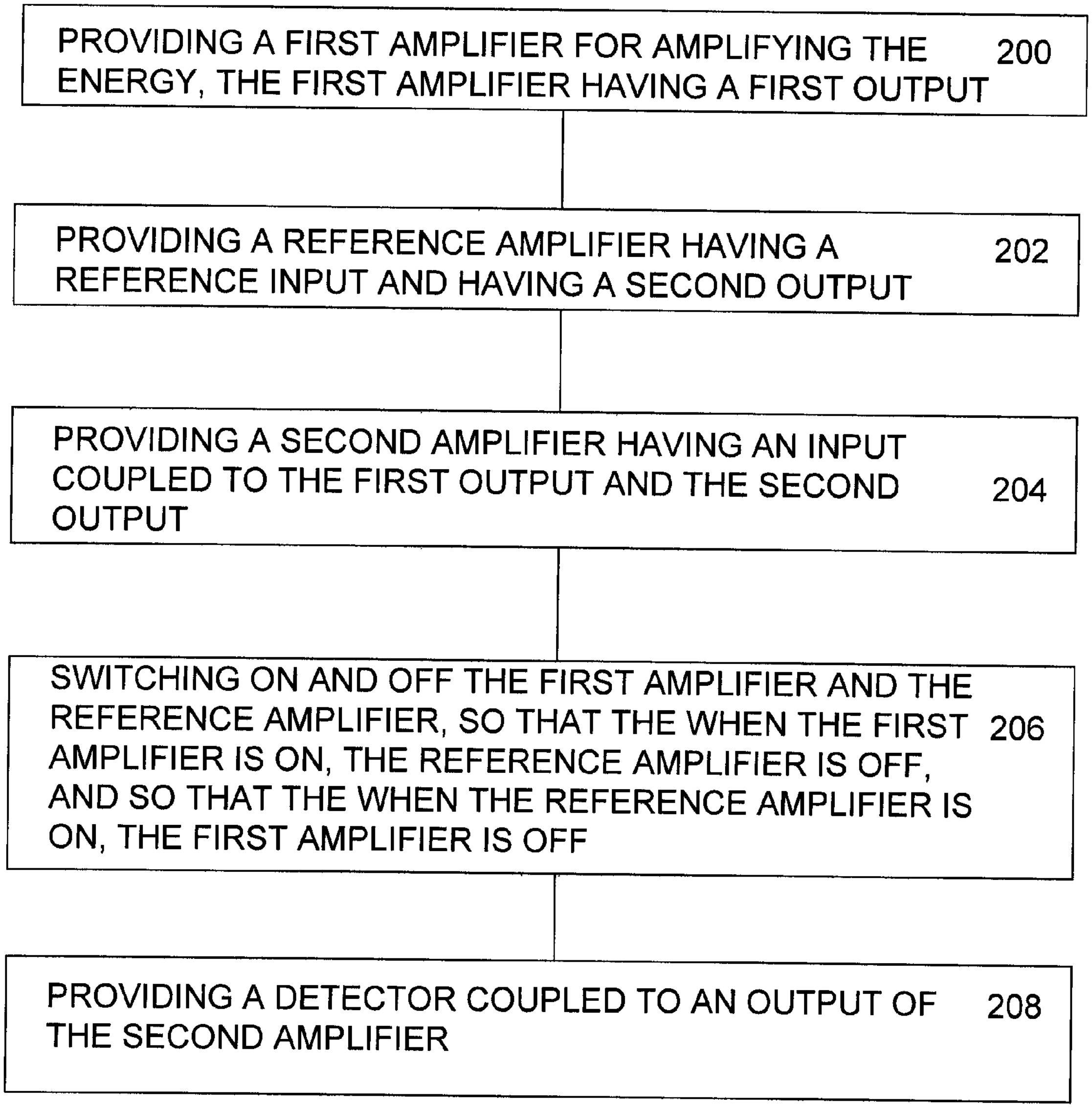
FIGS. 7A and 7B are flow diagrams of a method for cancelling noise in a radiometer in accordance with the present disclosure.
Figure 7B:
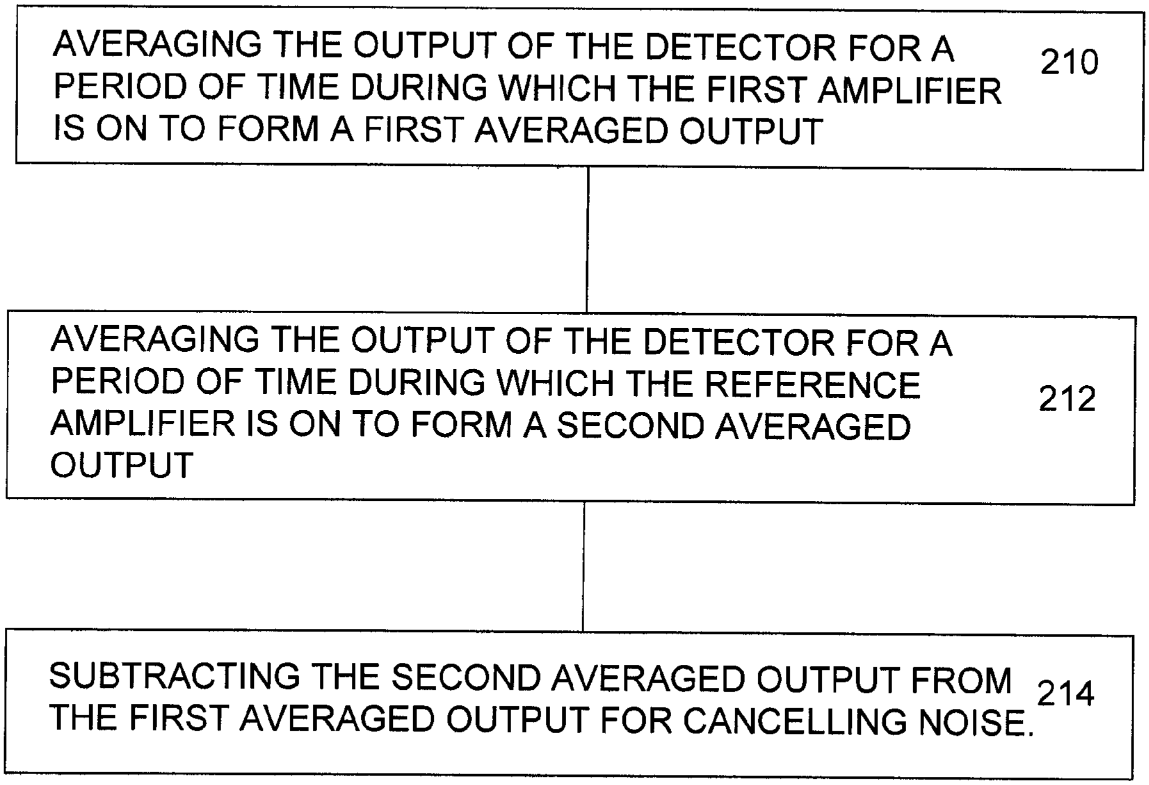

FIGS. 7A and 7B are flow diagrams of a method for cancelling noise in a radiometer in accordance with the present disclosure. The method includes step 200 of providing a first amplifier for amplifying energy received by the radiometer, the first amplifier having a first output, step 202 of providing a reference amplifier having a reference input and having a second output, step 204 of providing a second amplifier having an input coupled to the first output and the second output, step 206 of switching on and off the first amplifier and the reference amplifier, so that the when the first amplifier is on, the reference amplifier is off, and so that the when the reference amplifier is on, the first amplifier is off, and step 208 of providing a detector coupled to an output of the second amplifier.

In step 210 of the method the output of the detector is averaged for a period of time during which the first amplifier is on to form a first averaged output. In step 212 the output of the detector is averaged for a period of time during which the reference amplifier is on to form a second averaged output. Finally in step 214 the second averaged output is subtracted from the first averaged output for cancelling noise.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A radiometer for sensing energy comprising:

a first amplifier for amplifying the energy, the first amplifier having a first output;

a reference amplifier having a reference input and having a second output, wherein the reference input is different than the energy;

a second amplifier having an input coupled to the first output and the second output; and a controller for switching on and off the first amplifier and the reference amplifier, so that when the first amplifier is on, the reference amplifier is off, and so that when the reference amplifier is on, the first amplifier is off.

2. The radiometer of claim 1 further comprising:

a detector coupled to an output of the second amplifier.

3. The radiometer of claim 2 further comprising wherein the detector comprises a diode.

4. The radiometer of claim 2 further comprising:

a processor coupled to an output of the detector.

5. The radiometer of claim 4 wherein the processor comprises an analog or digital signal processor, a computer or an ASIC.

6. The radiometer of claim 4 wherein:

the processor averages the output of the detector for a period of time during which the first amplifier is on to form a first averaged output;

the processor averages the output of the detector for a period of time during which the reference amplifier is on to form a second averaged output; and the second averaged output is subtracted from the first averaged output for cancelling noise added to both the first and second averaged output.

7. The radiometer of claim 4 wherein:

the processor averages the output of the detector for a period of time during which the first amplifier is on to form a first scene output $V_{scene,p}$, and the processor averages the output of the detector for a period of time during which the reference amplifier is on to form a first reference output $V_{ref,p}$ according to $$V'_{scene,p} = \frac{1}{DT}\int_{-\frac{1}{2}DT}^{\frac{1}{2}DT} v(t - pT)dt,\ V'_{ref,p} = \frac{1}{DT}\int_{-\frac{1}{2}DT}^{\frac{1}{2}DT} v_{ref}\left(t - \left(P + \frac{1}{2}\right)T\right)dt;$$

the processor averages a plurality of the first scene outputs $V_{scene}$ and a plurality of the first reference output $V_{ref}$ over an integration time, according to $$V_{scene,n} = \frac{1}{P}\sum_{p=0}^{P-1} V'_{scene,nP+p},\ V_{ref,n} = \frac{1}{P}\sum_{p=0}^{P-1} V'_{ref,nP+p}.;$$

and the processor subtracts $V_{ref,n}$ from $V_{scene,n}$ for cancelling noise.

8. The radiometer of claim 1 further comprising:

an antenna coupled to an input of the first amplifier.

9. The radiometer of claim 1 wherein the radiometer comprises a millimeter wave sensor.

10. The radiometer claim 1 further comprising an array of radiometers according to claim 1;

wherein the array of radiometers comprises a horizontal or vertical one dimensional array, or a two dimensional array.

11. The radiometer of claim 1 wherein the switching on and off is performed at a frequency of 1 kHz or greater.

12. The radiometer of claim 1 wherein the first amplifier, the reference amplifier, and the second amplifier are low noise amplifiers.

13. The radiometer of claim 1 wherein the first amplifier is a first stage amplifier and the second amplifier is a second stage amplifier.

14. A method for cancelling noise in a radiometer for sensing energy, the method comprising:

providing a first amplifier for amplifying the energy, the first amplifier having a first output;

providing a reference amplifier having a reference input and having a second output, wherein the reference input is different than the energy;

providing a second amplifier having an input coupled to the first output and the second output;

switching on and off the first amplifier and the reference amplifier, so that when the first amplifier is on, the reference amplifier is off, and so that when the reference amplifier is on, the first amplifier is off; and providing a detector coupled to an output of the second amplifier.

15. The method of claim 14 wherein the switching on and off is performed at a frequency of 1 kHz or greater.

16. The method of claim 14 further comprising:

averaging the output of the detector for a period of time during which the first amplifier is on to form a first averaged output;

averaging the output of the detector for a period of time during which the reference amplifier is on to form a second averaged output; and subtracting the second averaged output from the first averaged output for cancelling noise.

17. The method of claim 14 further comprising:

averaging the output of the detector for a period of time during which the first amplifier is on to form a first scene output $V_{scene,p}$, and the processor averages the output of the detector for a period of time during which the reference amplifier is on to form a first reference output $V_{ref,p}$ according to $$V'_{scene,p} = \frac{1}{DT}\int_{-\frac{1}{2}DT}^{\frac{1}{2}DT} v(t - pT)dt,\ V'_{ref,p} = \frac{1}{DT}\int_{-\frac{1}{2}DT}^{\frac{1}{2}DT} v_{ref}\left(t - \left(p + \frac{1}{2}\right)T\right)dt;$$

averaging a plurality of the first scene outputs $V_{scene}$ and a plurality of the first reference output $V_{ref}$ over an integration time, according to $$V_{scene,n} = \frac{1}{P}\sum_{p=0}^{P-1} V'_{scene,nP+p},\ V_{ref,n} = \frac{1}{P}\sum_{p=0}^{P-1} V'_{ref,nP+p};$$

and subtracting $V_{ref,n}$ from $V_{scene,n}$ for cancelling noise.

18. The method of claim 14 further comprising:

providing an antenna coupled to an input of the first amplifier.

19. The method of claim 14 wherein:

the first amplifier, the reference amplifier, and the second amplifier are low noise amplifiers.

20. The method of claim 14 wherein the first amplifier is a first stage amplifier and the second amplifier is a second stage amplifier.

* * * * *